United States Patent
Koller et al.

(10) Patent No.: US 8,289,019 B2
(45) Date of Patent: Oct. 16, 2012

(54) SENSOR

(75) Inventors: Adolf Koller, Regensburg (DE); Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 359 days.

(21) Appl. No.: 12/369,255

(22) Filed: Feb. 11, 2009

(65) Prior Publication Data
US 2010/0201356 A1 Aug. 12, 2010

(51) Int. Cl.
G01R 33/09 (2006.01)
G01B 7/30 (2006.01)

(52) U.S. Cl. ............... 324/252; 324/207.21; 324/207.25

(58) Field of Classification Search ............. 324/207.21, 324/252, 207.25
See application file for complete search history.

(56) References Cited

U.S. PATENT DOCUMENTS

| | | | |
|---|---|---|---|
| 5,963,028 A * | 10/1999 | Engel et al. ................ | 324/207.2 |
| 6,274,939 B1 | 8/2001 | Wolf | |
| 6,956,366 B2 * | 10/2005 | Butzmann ................ | 324/207.21 |
| 7,053,602 B2 * | 5/2006 | Jin et al. .................... | 324/207.16 |
| 7,250,760 B2 * | 7/2007 | Ao ................................ | 324/252 |
| 2002/0055589 A1 * | 5/2002 | Matsuoka et al. ............ | 525/178 |
| 2004/0012895 A1 * | 1/2004 | Drewes et al. ............. | 360/324.1 |
| 2004/0174164 A1 * | 9/2004 | Ao ................................ | 324/252 |
| 2005/0146052 A1 * | 7/2005 | Sakamoto et al. ............ | 257/780 |
| 2006/0097715 A1 * | 5/2006 | Oohira et al. ............... | 324/207.2 |
| 2007/0013367 A1 * | 1/2007 | Murata .................... | 324/207.21 |
| 2007/0091509 A1 * | 4/2007 | Yi et al. ........................ | 360/313 |
| 2007/0210792 A1 * | 9/2007 | Wakui et al. .................. | 324/252 |
| 2009/0027048 A1 * | 1/2009 | Sato et al. ..................... | 324/247 |
| 2009/0140725 A1 * | 6/2009 | Ausserlechner ........... | 324/207.2 |
| 2009/0243595 A1 * | 10/2009 | Theuss et al. ............ | 324/207.11 |
| 2011/0043201 A1 * | 2/2011 | Zhou ............................. | 324/252 |

FOREIGN PATENT DOCUMENTS
WO 03/040659 5/2003

* cited by examiner

*Primary Examiner* — Bot Ledynh
(74) *Attorney, Agent, or Firm* — Dicke, Billig & Czaja, PLLC (57) ABSTRACT

A sensor including a substrate and magnetic material. The substrate has a main major surface and includes at least two spaced apart ferromagnetic layers. The magnetic material encapsulates the substrate such that the magnetic material is adjacent the main major surface.

23 Claims, 9 Drawing Sheets

SENSOR

BACKGROUND

Typically, magneto-resistive (XMR) sensors include one or more XMR sensing or sensor elements for measuring a magnetic field. XMR sensor elements include anisotropic magneto-resistance (AMR) sensor elements, giant magneto-resistance (GMR) sensor elements, tunneling magneto-resistance (TMR) sensor elements, and colossal magneto-resistance (CMR) sensor elements.

Sometimes, in speed sensors, a permanent magnet is attached to a magnetic field sensor that includes multiple XMR sensor elements. The permanent magnet provides a back bias magnetic field for the multiple XMR sensor elements. The magnetic field sensor is placed in front of a toothed magnetically permeable wheel or disk. As the disk rotates, the teeth pass in front of the magnetic field sensor and generate small field variations in the magnetic field. These small field variations are detected by the XMR sensor elements and include information about rotational speed and angular position of the rotating disk.

However, a small misplacement of the back bias magnet or diverging magnetic field lines of the back bias magnetic field may result in magnetic field components that adversely affect the XMR sensor elements. These magnetic field lines may drive the XMR sensor elements into saturation and render the XMR sensor elements useless for detecting variations in the magnetic field.

For these and other reasons there is a need for the present invention.

SUMMARY

One embodiment described in the disclosure provides a sensor including a substrate and magnetic material. The substrate has a main major surface and includes at least two spaced apart ferromagnetic layers. The magnetic material encapsulates the substrate such that the magnetic material is adjacent the main major surface.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
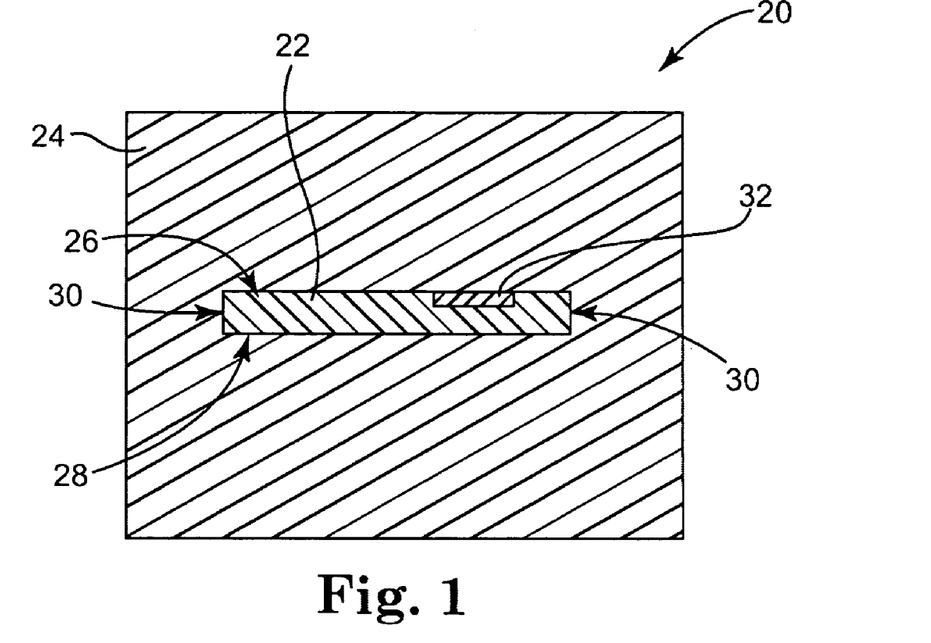
FIG. 1 is a diagram illustrating one embodiment of a magnetic sensor.

FIG. 1 is a diagram illustrating one embodiment of a magnetic sensor 20. In one embodiment, magnetic sensor 20 is an XMR sensor. In one embodiment, magnetic sensor 20 is a speed sensor. In one embodiment, magnetic sensor 20 is used in an automobile application. In one embodiment, magnetic sensor 20 senses the movement in a component, such as a wheel, a cam shaft, a crank shaft or a transmission part. In other embodiments, magnetic sensor 20 is a sensor, such as a proximity sensor, a motion sensor or a position sensor, or magnetic sensor 20 is used in an application, such as an industrial or consumer application.

Magnetic sensor 20 includes a substrate 22 and magnetic material 24. Substrate 22 has a main major surface 26, an opposing major surface 28 and edges 30. Main major surface 26 and opposing major surface 28 are opposing major surfaces 26 and 28. In one embodiment, substrate 22 is a semiconductor die. In one embodiment, substrate 22 is a semiconductor die that includes an integrated circuit. In one embodiment, substrate 22 is a semiconductor die that includes peripheral circuitry for evaluating parameters in magnetic sensor 20.

Figure 2:
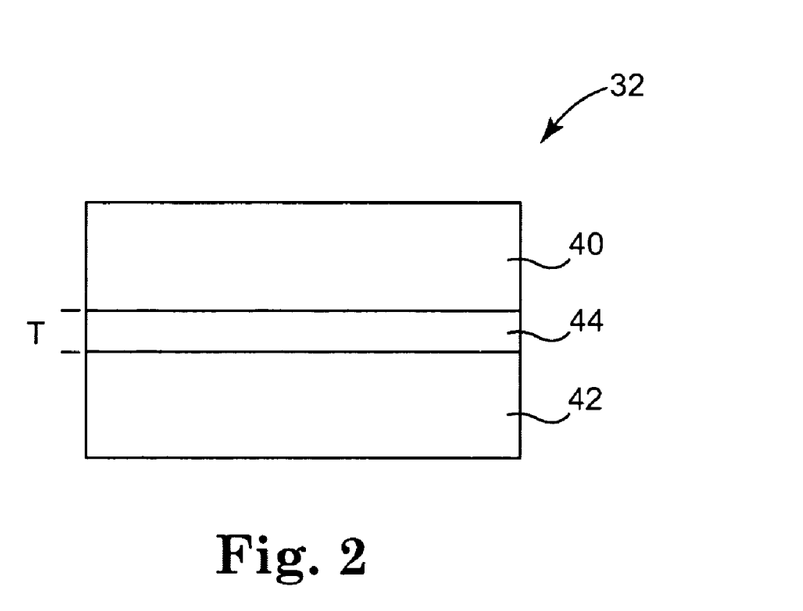
FIG. 2 is a diagram illustrating one embodiment of a sensing element.

Substrate 22 includes a sensing element 32 that includes at least two spaced apart ferromagnetic layers, (see FIG. 2). In one embodiment, the at least two spaced apart ferromagnetic layers form a magneto-resistor. In one embodiment, the at least two spaced apart ferromagnetic layers are part of a GMR sensing element. In one embodiment, substrate 22 is a semiconductor die that includes an integrated circuit coupled to the at least two spaced apart ferromagnetic layers. In one embodiment, substrate 22 is a semiconductor die that includes peripheral circuitry for evaluating the resistance of the at least two spaced apart ferromagnetic layers.

Magnetic material 24 encapsulates substrate 22, such that magnetic material 24 is adjacent main major surface 26. Magnetic material 24 is substantially parallel to the opposing major surfaces 26 and 28 at the interface between magnetic material 24 and substrate 22. Also, as used herein, magnetic material 24 is adjacent main major surface 26 if substrate 22 is coated with one or more layers of material. In one embodiment, magnetic material 24 is a mold material. In one embodiment, magnetic material 24 is a mold material that includes magnetic particles and a polymer. In one embodiment, magnetic material 24 is applied via injection molding. In one embodiment, magnetic material 24 is applied via compression molding. In one embodiment, magnetic material 24 is applied via transfer molding.

In one embodiment, substrate 22 is coated with one or more layers of insulating material to electrically isolate substrate 22, including sensing element 32, from magnetic material 24. In one embodiment, major surface 26 is coated with one or more layers of insulating material to electrically isolate major surface 26, including sensing element 32, from magnetic material 24. In one embodiment, substrate 22 and/or major surface 26 is insulated via being dipped in resin and drying the resin. In one embodiment, substrate 22 and/or major surface 26 is insulated via a spray coating process. In one embodiment, substrate 22 and/or major surface 26 is insulated via a plasma deposition process with a process, such as an organo-silicon chemistry process.

FIG. 2 is a diagram illustrating one embodiment of sensing element 32 that includes two spaced apart ferromagnetic layers 40 and 42. The two spaced apart ferromagnetic layers 40 and 42 form a magneto-resistor. In one embodiment, the two spaced apart ferromagnetic layers 40 and 42 are part of a GMR sensing element. In one embodiment, the two spaced apart ferromagnetic layers 40 and 42 are part of a TMR sensing element.

Sensing element 32 includes a spacer layer 44 situated between the two spaced apart ferromagnetic layers 40 and 42. The thickness T of spacer layer 44 lies in the range from more than 0.1 nanometers (nm) to less than 10 nm, such that the two spaced apart ferromagnetic layers are spaced apart by more than 0.1 nanometers and less than 10 nanometers. In one embodiment, spacer layer 44 is a non-ferromagnetic layer between the two spaced apart ferromagnetic layers 40 and 42. In one embodiment, spacer layer 44 is an insulating layer between the two spaced apart ferromagnetic layers 40 and 42.

GMR and TMR sensing elements are sensitive to the direction of an applied magnetic field and changes in the direction of the applied magnetic field, as opposed to Hall sensors that are sensitive to the strength of the magnetic field. GMR and TMR sensing elements provide one resistance if the ferromagnetic layers are aligned in parallel and another resistance if the ferromagnetic layers are aligned in anti-parallel.

In one embodiment, sensing element 32 is a multilayer GMR sensing element that includes the two spaced apart ferromagnetic layers 40 and 42 separated by a thin non-ferromagnetic spacer layer 44. At certain thicknesses T of spacer layer 44, the Ruderman-Kittel-Kasuya-Yosida (RKKY) coupling between the two spaced apart ferromagnetic layers 40 and 42 becomes anti-ferromagnetic and the magnetizations of the two spaced apart ferromagnetic layers 40 and 42 align in anti-parallel. The electrical resistance of sensing element 32 is normally higher in the anti-parallel case, where the difference can reach more than 10% at room temperature. In one embodiment, spacer layer 44 has a thickness T of about 1 nm. In one embodiment, the two spaced apart ferromagnetic layers 40 and 42 are iron (Fe) and the non-ferromagnetic spacer layer 44 is Chromium (Cr).

In one embodiment sensing element 32 is a spin valve GMR sensing element that includes the two ferromagnetic layers 40 and 42 separated by a thin non-ferromagnetic spacer layer 44, but without RKKY coupling. If the coercive magnetic fields of the two spaced apart ferromagnetic layers 40 and 42 are different, the magnetizations of the two spaced apart ferromagnetic layers 40 and 42 can be switched independently to achieve parallel and anti-parallel alignment. The electrical resistance of sensing element 32 is normally higher in the anti-parallel case. In one embodiment, spacer layer 44 has a thickness T of about 3 nm. In one embodiment, the two spaced apart ferromagnetic layers 40 and 42 are nickel-iron (NiFe) and the non-ferromagnetic spacer layer 44 is copper (Cu).

In one embodiment, sensing element 32 is a TMR sensing element and spacer layer 44 is an insulator. The resistance of the tunneling current between the two ferromagnetic layers 40 and 42 changes with the relative orientation of the magnetization of the two ferromagnetic layers 40 and 42. The resistance is normally higher in the anti-parallel case. In one embodiment, spacer layer 44 has a thickness T of about 1 nm. In one embodiment, the two spaced apart ferromagnetic layers 40 and 42 are iron (Fe) and the insulating spacer layer 44 is magnesium oxide (MgO).

Figure 3:
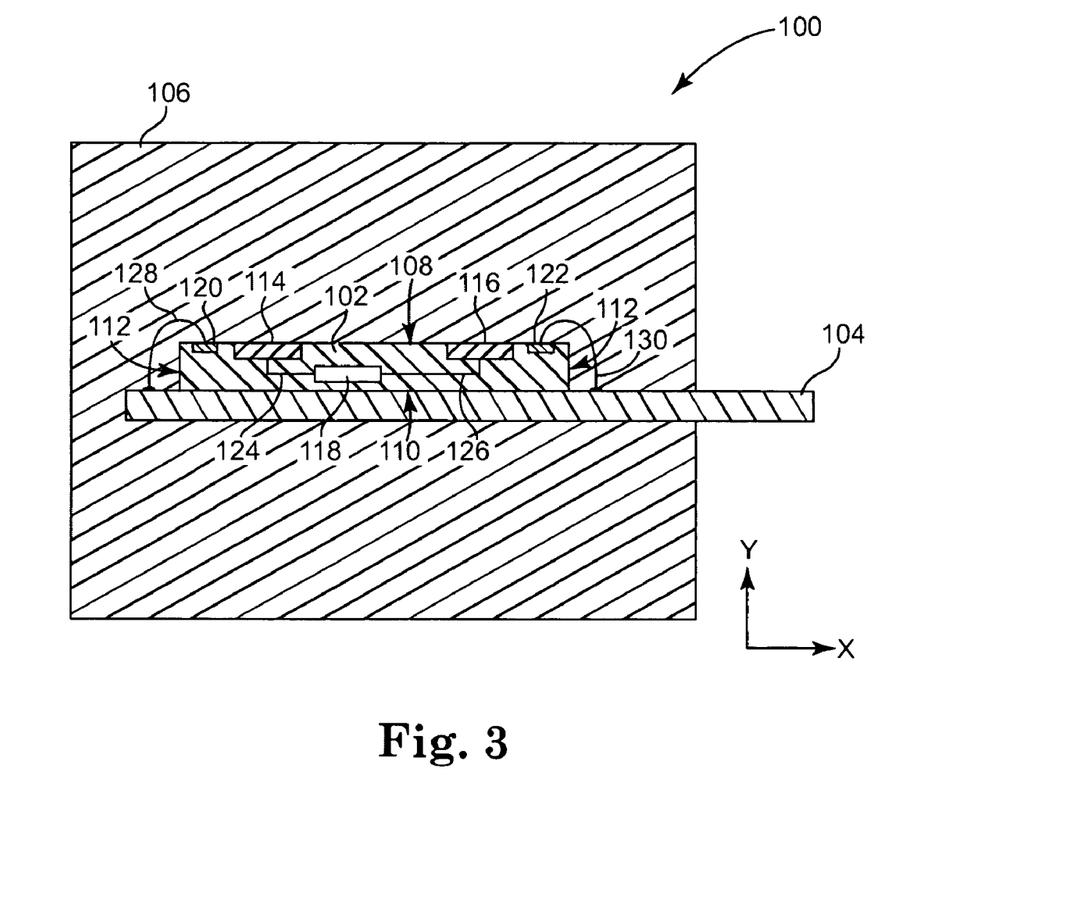
FIG. 3 is a diagram illustrating one embodiment of a magnetic sensor that is an XMR sensor.

FIG. 3 is a diagram illustrating one embodiment of a magnetic sensor 100 that is an XMR sensor. Magnetic sensor 100 is similar to magnetic sensor 20 of FIG. 1. In one embodiment, magnetic sensor 100 is a GMR sensor. In one embodiment, magnetic sensor 100 is a TMR sensor. In one embodiment, magnetic sensor 100 is a speed sensor. In one embodiment, magnetic sensor 100 is in an automobile application. In one embodiment, magnetic sensor 100 senses the movement of a component, such as a wheel, a cam shaft, a crank shaft or a transmission part. In other embodiments, magnetic sensor 100 is a sensor, such as a proximity sensor, a motion sensor or a position sensor, or magnetic sensor 100 is used in an application, such as an industrial or consumer application.

Magnetic sensor 100 includes a substrate 102, a carrier structure 104 and magnetic material 106. Substrate 102 has a main major surface 108, an opposing major surface 110 and edges 112. Main major surface 108 and opposing major surface 110 are opposing major surfaces 108 and 110. Substrate 102 is attached to carrier structure 104 via opposing major surface 110.

Substrate 102 is a semiconductor die that includes sensing elements 114 and 116, an integrated circuit 118 and substrate contacts 120 and 122. Each of the sensing elements 114 and 116 includes at least two spaced apart ferromagnetic layers that form a magneto-resistor. Each of the sensing elements 114 and 116 is similar to sensing element 32 of FIG. 2. In one embodiment, the at least two spaced apart ferromagnetic layers are part of a GMR sensing element. In one embodiment, the at least two spaced apart ferromagnetic layers are part of a TMR sensing element.

Integrated circuit 118 is electrically coupled to each of the sensing elements 114 and 116 via sensing element paths 124 and 126. Integrated circuit 118 is electrically coupled to sensing element 114 via sensing element path 124, and integrated circuit 118 is electrically coupled to sensing element 116 via sensing element path 126. Integrated circuit 118 is electrically coupled to the at least two spaced apart ferromagnetic layers in each of the sensing elements 114 and 116 and includes peripheral circuitry for evaluating parameters in magnetic sensor 100, such as the resistance of the at least two spaced apart ferromagnetic layers in each of the sensing elements 114 and 116.

Substrate 102 is electrically coupled to carrier structure 104 via substrate contacts 120 and 122 and contact elements 128 and 130. Substrate contact 120 is electrically coupled to carrier structure 104 via contact element 128 and substrate contact 122 is electrically coupled to carrier structure 104 via contact element 130. Substrate 102 communicates sensed results to other circuits via substrate contacts 120 and 122, contact elements 128 and 130 and carrier structure 104. In one embodiment, contact elements 128 and 130 are wires. In one embodiment carrier structure 106 is a leadframe carrier structure.

Magnetic material 106 encapsulates substrate 102, contact elements 128 and 130 and part of carrier structure 104. Magnetic material 106 encapsulates substrate 102, such that magnetic material 106 is adjacent main major surface 108 and substantially parallel to the opposing major surfaces 108 and 110 at the interface between magnetic material 106 and substrate 102, where carrier structure 104 is part of the interface between magnetic material 106 and substrate 102. Also, magnetic material 106 is adjacent main major surface 108 even if substrate 102 is coated with one or more layers of material.

In one embodiment, substrate 102, contact elements 128 and 130 and part of carrier structure 104 are coated with one or more layers of insulating material to electrically isolate them, including sensing elements 114 and 116, from magnetic material 106. In one embodiment, major surface 108, contact elements 128 and 130 and part of carrier structure 104 are coated with one or more layers of insulating material to electrically isolate them, including sensing elements 114 and 116, from magnetic material 106. In one embodiment, substrate 102 and/or major surface 108, contact elements 128 and 130 and part of carrier structure 104 are insulated via being dipped in resin and drying the resin. In one embodiment, substrate 102 and/or major surface 108, contact elements 128 and 130 and part of carrier structure 104 are insulated via a spray coating process. In one embodiment, substrate 102 and/or major surface 108, contact elements 128 and 130 and part of carrier structure 104 are insulated via a plasma deposition process with a process, such as an organo-silicon chemistry process.

Magnetic material 106 is a mold material that includes magnetic particles and a polymer. The magnetic particles are a ferromagnetic material. In one embodiment, magnetic material 106 is a mold material that includes nylon. In one embodiment, magnetic material 106 is a mold material that includes epoxy. In one embodiment, magnetic material 106 is applied via injection molding. In one embodiment, magnetic material 106 is applied via compression molding. In one embodiment, magnetic material 106 is applied via transfer molding.

Magnetic material 106 is magnetized to provide a back bias magnetic field for sensing elements 114 and 116. In one embodiment, magnetic material 106 is magnetized in the y-direction and sensing elements 114 and 116 sense the magnetic field and changes in the magnetic field in the x-direction.

In one embodiment, magnetic sensor 100 is a GMR sensor and sensing elements 114 and 116 are GMR sensing elements that are sensitive to magnetic fields in the x-direction. Magnetic material 106 is magnetized in the y-direction and provides a back bias magnetic field to GMR sensing elements 114 and 116. The static magnetic field has an x-direction magnetic field component of 0+/−2 milli-Teslas (mT) provided via magnetic material 106. GMR sensing elements 114 and 116, sense changes in the x-direction magnetic field component. In one embodiment, GMR sensing elements 114 and 116 go into saturation with an x-direction magnetic field component as low as +/−5 mT.

Figure 4:
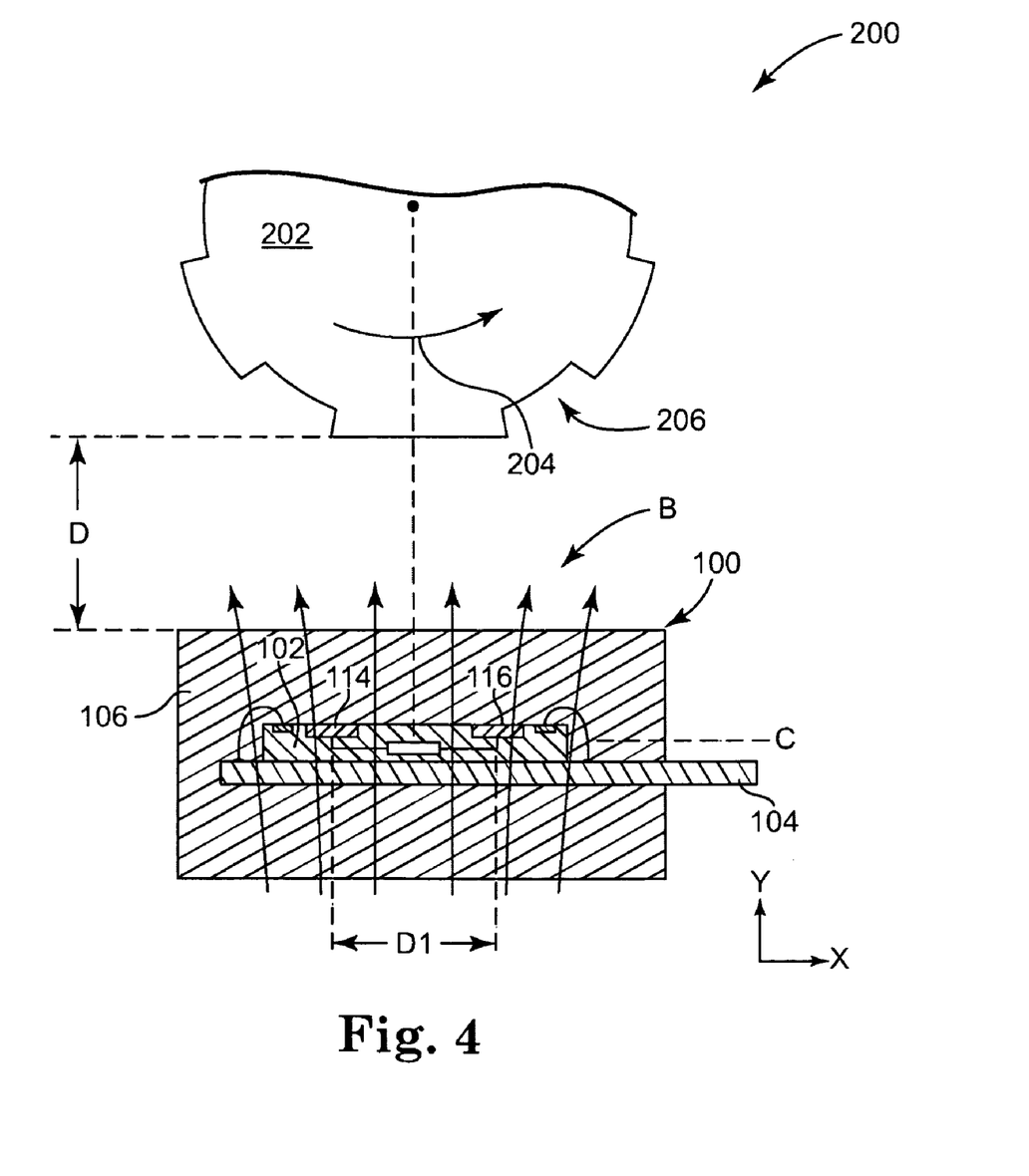
FIG. 4 is a diagram illustrating one embodiment of a speed sensor.

FIG. 4 is a diagram illustrating one embodiment of a speed sensor 200 for sensing the speed of a toothed wheel 202. Speed sensor 200 includes magnetic sensor 100 and toothed wheel 202. Magnetic sensor 100 is separated from toothed wheel 202 an air-gap distance D. In one embodiment, the air-gap distance D is 4.5 millimeters (mm).

Sensing elements 114 and 116 are GMR sensing elements separated a distance D1 and situated above the centerline C of magnetic material 106. In one embodiment, the distance D1 is 2.5 mm. In one embodiment, sensing elements 114 and 116 are situated about 50 micrometers (um) above the centerline C of magnetic material 106. In one embodiment, sensing elements 114 and 116 are situated about 100 um above the centerline C of magnetic material 106. In one embodiment, sensing elements 114 and 116 are situated about 200 um above the centerline C of magnetic material 106.

Magnetic material 106 provides bias magnetic field B to sensing elements 114 and 116. In this example, the bias magnetic field B is in the y-direction, which is perpendicular to the plane of sensing elements 114 and 116 and substrate 102. Sensing elements 114 and 116 are sensitive to changes in the magnetic field B in the x-direction.

Toothed wheel 202 is a ferromagnetic material and the teeth of toothed wheel 202 pass in front of sensing elements 114 and 116 as toothed wheel 202 rotates in the direction of arrow 204. This generates magnetic field variations in the x-direction of magnetic field B, which are detected by sensing elements 114 and 116. The detected magnetic field variations contain information about the angular position and rotational speed of toothed wheel 202. The variations in magnetic field B occur as toothed wheel 202 rotates between having a tooth centered between sensing elements 114 and 116, as shown in FIG. 4, and having a space, such as space 206, centered between sensing elements 114 and 116. The tooth centered position is referred to as a center position and the space centered position is referred to as a center-out position.

Figure 5:
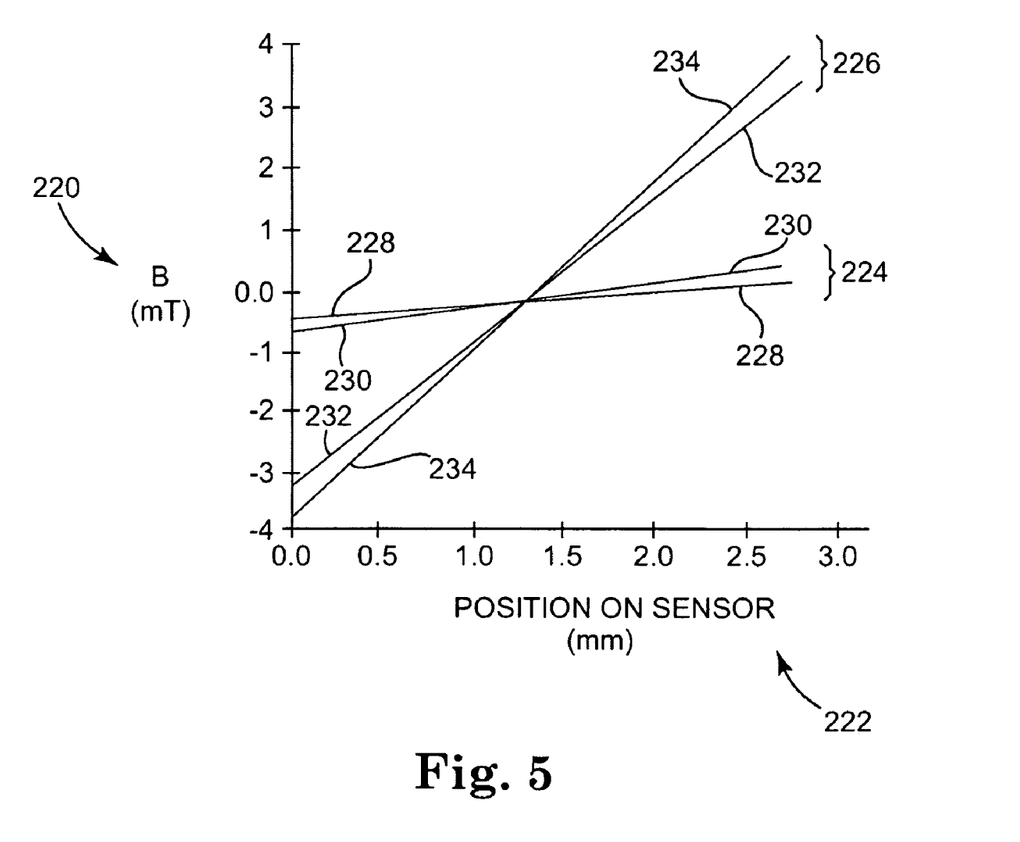
FIG. 5 is a graph illustrating the magnetic field B versus the position on a substrate.

FIG. 5 is a graph illustrating the magnetic field B at 220 verses the position on substrate 102 at 222. The graph was developed via simulations, where the magnetic field B at 220 is graphed in mT and the position on substrate 102 at 222 is graphed in mm.

The graph includes two sets of averaged data, a first set of data at 224 and a second set of data at 226. The first set of data at 224 was obtained with sensing elements 114 and 116 situated 50 um above the centerline C of magnetic material 106. The second set of data at 226 was obtained with sensing elements 114 and 116 situated 100 um above the centerline C of magnetic material 106.

At 50 um above the centerline C and with toothed wheel 202 in the center position, the magnetic field B at the surface of substrate 102 is graphed via line 228. At 50 um above the centerline C and with toothed wheel 202 in the center-out position, the magnetic field B at the surface of substrate 102 is graphed via line 230. Sensing element 114 is at the 0.0 mm position on substrate 102 and sensing element 116 is at the 2.5 mm position on substrate 102. The difference between lines 228 and 230 at the 0.0 mm position is detected via sensing element 114 and the difference between lines 228 and 230 at the 2.5 mm position is detected via sensing element 116. The detected differences are used to obtain the angular position and rotational speed of toothed wheel 202.

At 100 um above the centerline C and with toothed wheel 202 in the center position, the magnetic field B at the surface of substrate 102 is graphed via line 232. At 100 um above the centerline C and with toothed wheel 202 in the center-out position, the magnetic field B at the surface of substrate 102 is graphed via line 234. The difference between lines 232 and 234 at the 0.0 mm position is detected via sensing element 114 and the difference between lines 232 and 234 at the 2.5 mm position is detected via sensing element 116. These detected differences are used to obtain the angular position and rotational speed of toothed wheel 202.

Figure 6:
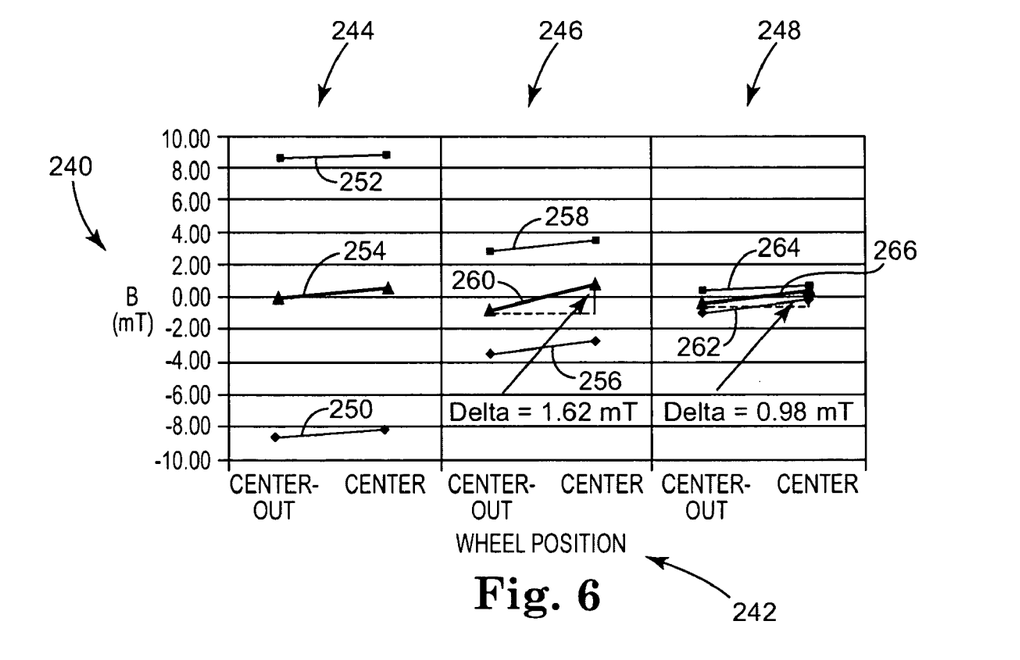
FIG. 6 includes graphs illustrating the magnetic field B versus the toothed wheel position.

FIG. 6 includes three graphs illustrating magnetic field B at 240 verses the toothed wheel position at 242. The first graph at 244 was obtained with sensing elements 114 and 116 situated 200 um above the centerline C of magnetic material 106. The second graph at 246 was obtained with sensing elements 114 and 116 situated 100 um above the centerline C of magnetic material 106. The third graph at 248 was obtained with sensing elements 114 and 116 situated 50 um above the centerline C of magnetic material 106. In each of the graphs 244, 246 and 248, the toothed wheel position at 242 moves between the center-out position on the left and the center position on the right.

In the first graph at 244, the magnetic field B on the surface of substrate 102 at 0.0 mm is graphed via line 250 and the magnetic field B on the surface of substrate 102 at 2.5 mm is graphed via line 252. The magnetic field B graphed via line 250 increases slightly from the center-out position on the left to the center position on the right, and the magnetic field B graphed via line 252 increases slightly from the center-out position on the left to the center position on the right. Line 254 combines lines 250 and 252 and can be used to obtain the angular position and rotational speed of toothed wheel 202. In one embodiment, sensing element 114 senses the magnetic field B at 0.0 mm and sensing element 116 senses the magnetic field B at 2.5 mm. The sensed values are provided to integrated circuit 118, which obtains the magnetic field delta that is used to obtain the angular position and rotational speed of toothed wheel 202.

In the second graph at 246, the magnetic field B on the surface of substrate 102 at 0.0 mm is graphed via line 256 and the magnetic field B on the surface of substrate 102 at 2.5 mm is graphed via line 258. The magnetic field B graphed via line 256 increases slightly from the center-out position on the left to the center position on the right, and the magnetic field B graphed via line 258 increases slightly from the center-out position on the left to the center position on the right. Line 260 combines lines 256 and 258 and provides a magnetic field delta of 1.62 mT that can be used to obtain the angular position and rotational speed of toothed wheel 202. In one embodiment, sensing element 114 senses the magnetic field B at 0.0 mm and sensing element 116 senses the magnetic field B at 2.5 mm. The sensed values are provided to integrated circuit 118, which obtains the magnetic field delta of 1.62 mT that is used to obtain the angular position and rotational speed of toothed wheel 202.

In the third graph at 248, the magnetic field B on the surface of substrate 102 at 0.0 mm is graphed via line 262 and the magnetic field B on the surface of substrate 102 at 2.5 mm is graphed via line 264. The magnetic field B graphed via line 262 increases slightly from the center-out position on the left to the center position on the right, and the magnetic field B graphed via line 264 increases slightly from the center-out position on the left to the center position on the right. Line 266 combines lines 262 and 264 and provides a magnetic field delta of 0.98 mT that can be used to obtain the angular position and rotational speed of toothed wheel 202. In one embodiment, sensing element 114 senses the magnetic field B at 0.0 mm and sensing element 116 senses the magnetic field B at 2.5 mm. The sensed values are provided to integrated circuit 118, which obtains the magnetic field delta of 0.98 mT that is used to obtain the angular position and rotational speed of toothed wheel 202.

The static magnetic field experienced on substrate 102 is less than +/−10 mT with sensing elements 114 and 116 situated 200 um above the centerline C of magnetic material 106, less than +/−4 mT with sensing elements 114 and 116 situated 100 um above the centerline C of magnetic material 106 and less than +/−2 mT with sensing elements 114 and 116 situated 50 um above the centerline C of magnetic material 106. In other embodiments, the static magnetic field can be up to +/−20 mT.

Figure 7:
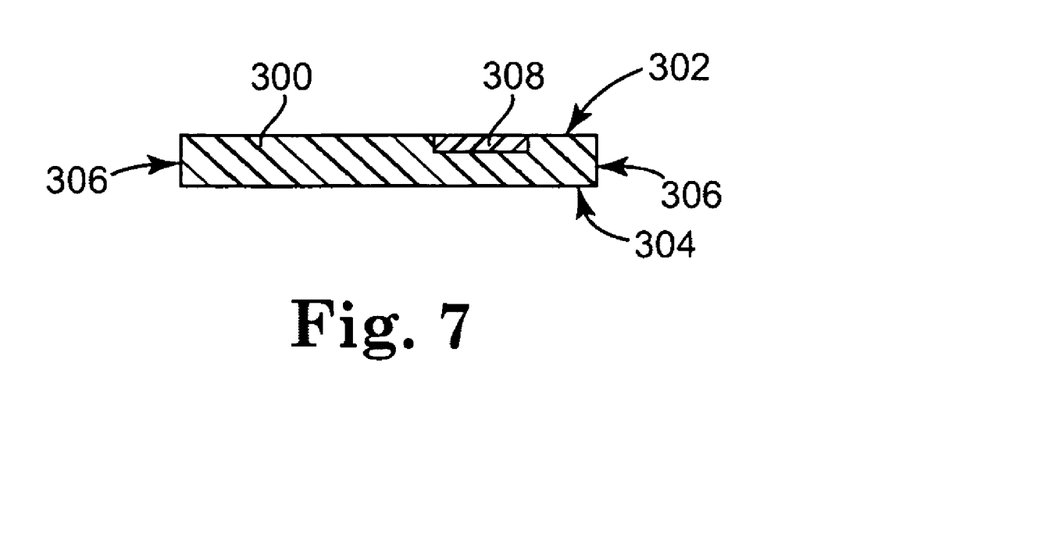
FIG. 7 is a diagram illustrating one embodiment of a substrate that is used to manufacture a magnetic sensor.
Figure 8:
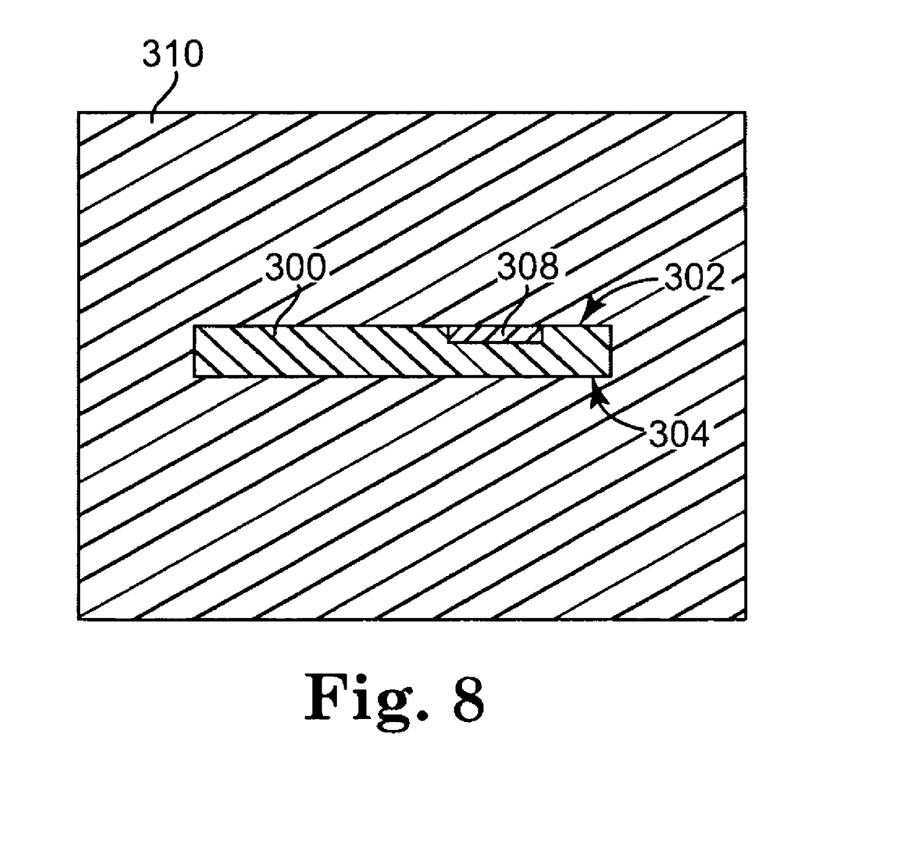
FIG. 8 is a diagram illustrating one embodiment of magnetic material encapsulating the substrate of FIG. 7.

FIGS. 7 and 8 are diagrams illustrating one embodiment of a method of manufacturing a magnetic sensor, such as magnetic sensor 20 of FIG. 1.

FIG. 7 is a diagram illustrating one embodiment of a substrate 300 that is used to manufacture the magnetic sensor. Substrate 300 has a main major surface 302, an opposing major surface 304 and edges 306. Main major surface 302 and opposing major surface 304 are opposing major surfaces 302 and 304. In one embodiment, substrate 300 is a semiconductor die. In one embodiment, substrate 300 is a semiconductor die that includes an integrated circuit. In one embodiment, substrate 300 is a semiconductor die that includes peripheral circuitry for evaluating parameters in the magnetic sensor.

Substrate 300 includes a sensing element 308 that includes at least two spaced apart ferromagnetic layers, (see FIG. 2). In one embodiment, the at least two spaced apart ferromagnetic layers form a magneto-resistor. In one embodiment, a non-ferromagnetic layer is provided between the at least two spaced apart ferromagnetic layers. In one embodiment, an insulating layer is provided between the at least two spaced apart ferromagnetic layers. In one embodiment, the at least two spaced apart ferromagnetic layers are part of a GMR sensing element. In one embodiment, the at least two spaced apart ferromagnetic layers are part of a TMR sensing element. In one embodiment, substrate 300 is a semiconductor die that includes an integrated circuit coupled to the at least two spaced apart ferromagnetic layers. In one embodiment, substrate 300 is a semiconductor die that includes peripheral circuitry for evaluating the resistance of the at least two spaced apart ferromagnetic layers.

In one embodiment, substrate 300 is coated with one or more layers of insulating material to electrically isolate substrate 300, including sensing element 308, from magnetic material 310 (shown in FIG. 8). In one embodiment, main major surface 302 is coated with one or more layers of insulating material to electrically isolate main major surface 302, including sensing element 308, from magnetic material 310. In one embodiment, substrate 300 and/or main major surface 302 is insulated via being dipped in resin and drying the resin. In one embodiment, substrate 300 and/or main major surface 302 is insulated via a spray coating process. In one embodiment, substrate 300 and/or main major surface 302 is insulated via a plasma deposition process with a process, such as an organo-silicon chemistry process.

FIG. 8 is a diagram illustrating one embodiment of magnetic material 310 encapsulating substrate 300. Magnetic material 310 is adjacent main major surface 302, and magnetic material 310 is substantially parallel to opposing major surfaces 302 and 304 at the interface between magnetic material 310 and substrate 300. Also, as used herein, magnetic material 310 is adjacent main major surface 302 if substrate 300 is coated with one or more layers of material.

In one embodiment, magnetic material 310 is a mold material. In one embodiment, magnetic material 310 is a mold material that includes magnetic particles and a polymer. In one embodiment, magnetic material 310 is a mold material that includes ferromagnetic particles. In one embodiment, magnetic material 310 is a mold material that includes nylon. In one embodiment, magnetic material 310 is a mold material that includes epoxy. In one embodiment, magnetic material 310 is applied via injection molding. In one embodiment, magnetic material 310 is applied via compression molding. In one embodiment, magnetic material 310 is applied via transfer molding.

FIGS. 9-12 are diagrams illustrating one embodiment of a method of manufacturing a magnetic sensor, such as magnetic sensor 100 of FIG. 3.

Figure 9:
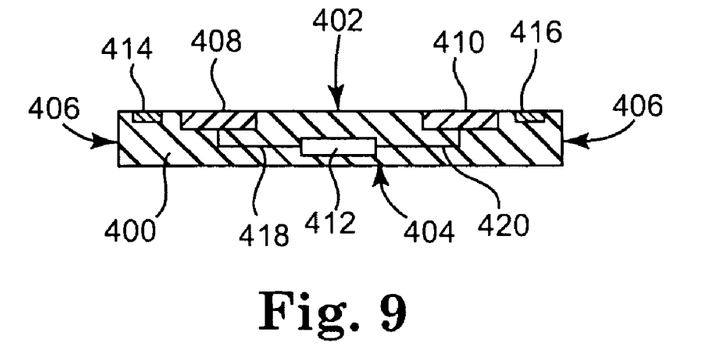
FIG. 9 is a diagram illustrating another embodiment of a substrate that is used to manufacture a magnetic sensor.

FIG. 9 is a diagram illustrating one embodiment of a substrate 400 that is used to manufacture the magnetic sensor. Substrate 400 has a main major surface 402, an opposing major surface 404 and edges 406. Main major surface 402 and opposing major surface 404 are opposing major surfaces 402 and 404.

Substrate 400 is a semiconductor die that includes sensing elements 408 and 410, an integrated circuit 412 and substrate contacts 414 and 416. Each of the sensing elements 408 and 410 includes at least two spaced apart ferromagnetic layers that form a magneto-resistor. Each of the sensing elements 408 and 410 is similar to sensing element 32 of FIG. 2. In one embodiment, the at least two spaced apart ferromagnetic layers are part of a GMR sensing element. In one embodiment, the at least two spaced apart ferromagnetic layers are part of a TMR sensing element.

Integrated circuit 412 is electrically coupled to each of the sensing elements 408 and 410 via sensing element paths 418 and 420. Integrated circuit 412 is electrically coupled to sensing element 408 via sensing element path 418, and integrated circuit 412 is electrically coupled to sensing element 410 via sensing element path 420. Integrated circuit 412 is electrically coupled to the at least two spaced apart ferromagnetic layers in each of the sensing elements 408 and 410 and includes peripheral circuitry for evaluating the resistance of the at least two spaced apart ferromagnetic layers in each of the sensing elements 408 and 410.

Figure 10:
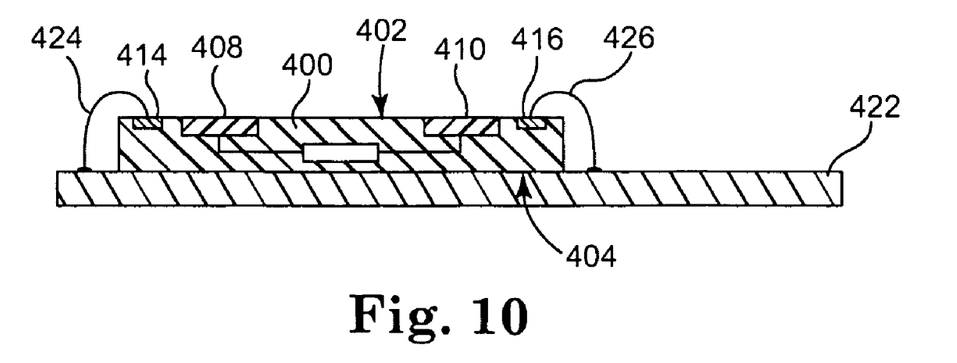
FIG. 10 is a diagram illustrating one embodiment of a carrier structure attached to the substrate of FIG. 9.

FIG. 10 is a diagram illustrating one embodiment of a carrier structure 422 attached to substrate 400. Substrate 400 is attached to carrier structure 422 via opposing major surface 404. Substrate 400 is electrically coupled to carrier structure 422 via substrate contacts 414 and 416 and contact elements 424 and 426. Substrate contact 414 is electrically coupled to carrier structure 422 via contact element 424 and substrate contact 416 is electrically coupled to carrier structure 422 via contact element 426. Substrate 400 communicates sensed results to other circuits via substrate contacts 414 and 416, contact elements 424 and 426 and carrier structure 422. In one embodiment, contact elements 424 and 426 are wires. In one embodiment carrier structure 422 is a leadframe carrier structure.

Figure 11:
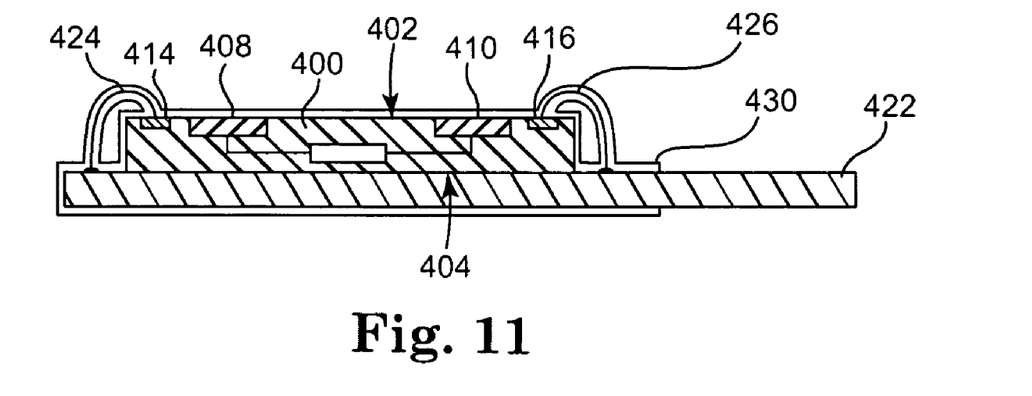
FIG. 11 is a diagram illustrating one embodiment of the substrate, contact elements, and part of the carrier structure coated with one or more layers of insulating material.

FIG. 11 is a diagram illustrating one embodiment of substrate 400, contact elements 424 and 426 and part of carrier structure 422 coated with one or more layers of insulating material 430. This electrically isolates substrate 400, contact elements 424 and 426 and part of carrier structure 422, including sensing elements 408 and 410, from magnetic material 428 (shown in FIG. 12). In other embodiments, main major surface 402, contact elements 424 and 426 and part of carrier structure 422 are coated with one or more layers of insulating material, similar to insulating material 430, to electrically isolate them, including sensing elements 408 and 410, from magnetic material 428.

In one embodiment, substrate 400 and/or main major surface 402, contact elements 424 and 426 and part of carrier structure 422 are insulated via being dipped in resin and drying the resin to form insulating material 430. In one embodiment, substrate 400 and/or main major surface 402, contact elements 424 and 426 and part of carrier structure 422 are insulated via a spray coating process to form insulating material 430. In one embodiment, substrate 400 and/or main major surface 402, contact elements 424 and 426 and part of carrier structure 422 are insulated via a plasma deposition process with a process, such as an organo-silicon chemistry process, to form insulating material 430.

Figure 12:
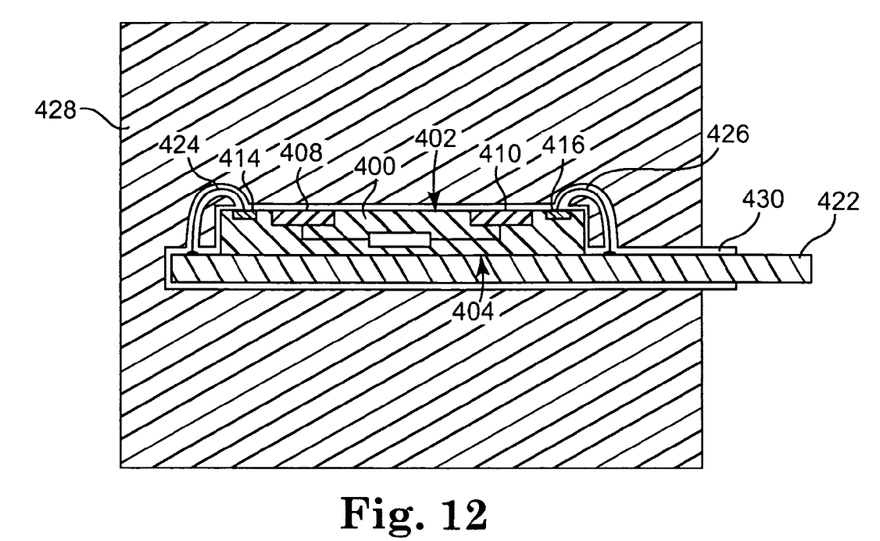
FIG. 12 is a diagram illustrating one embodiment of magnetic material encapsulating the substrate, contact elements and part of the carrier structure.

FIG. 12 is a diagram illustrating one embodiment of magnetic material 428 encapsulating substrate 400, contact elements 424 and 426 and part of carrier structure 422. Magnetic material 428 encapsulates substrate 400, such that magnetic material 428 is adjacent main major surface 402 and substantially parallel to the opposing major surfaces 402 and 404 at the interface between magnetic material 428 and substrate 400, where carrier structure 422 is part of the interface between magnetic material 428 and substrate 400. Also, magnetic material 428 is adjacent main major surface 402, where substrate 400 is coated with one or more layers of insulating material 430.

Magnetic material 428 is a mold material that includes magnetic particles and a polymer, where the magnetic particles are a ferromagnetic material. In one embodiment, magnetic material 428 is a mold material that includes nylon. In one embodiment, magnetic material 428 is a mold material that includes epoxy. In one embodiment, magnetic material 428 is applied via injection molding. In one embodiment, magnetic material 428 is applied via compression molding. In one embodiment, magnetic material 428 is applied via transfer molding.

Figure 13:
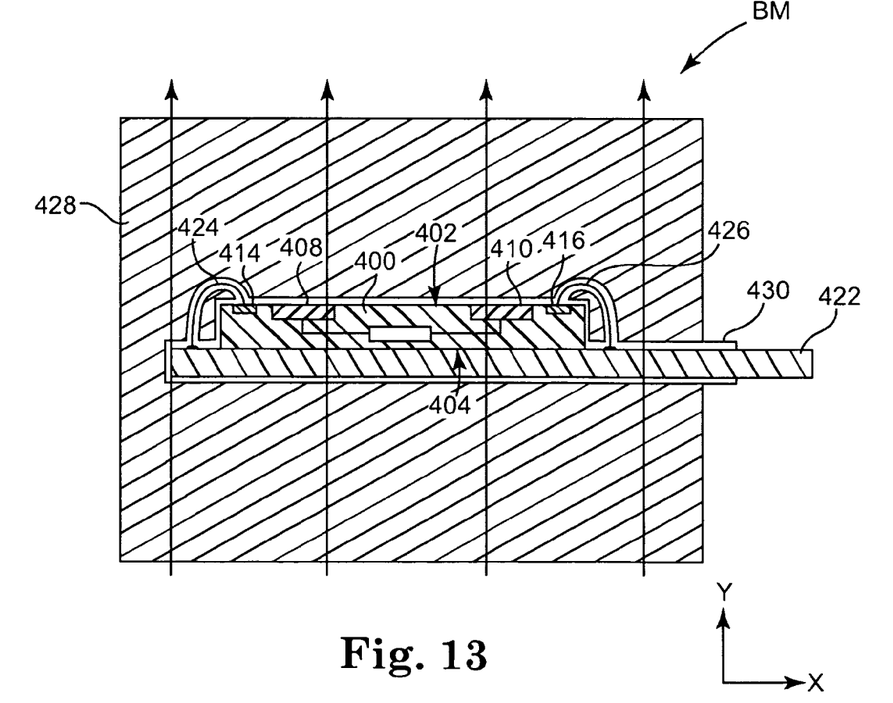
FIG. 13 is a diagram illustrating one embodiment of magnetizing the magnetic material.

FIG. 13 is a diagram illustrating one embodiment of magnetizing magnetic material 428, such that magnetic material 428 provides a back bias magnetic field for sensing elements 408 and 410. Magnetic material 428 is magnetized in the y-direction via magnetic field BM.

In one embodiment, the magnetic sensor of FIG. 13 is a GMR sensor and sensing elements 408 and 410 are GMR sensing elements that are sensitive to magnetic fields in the x-direction, where magnetic material 428 provides a back bias magnetic field in the y-direction to GMR sensing elements 408 and 410. In one embodiment, the static magnetic field provided via magnetic material 428 has an x-direction magnetic field component of less than 0+/−2 mT. In one embodiment, the static magnetic field provided via magnetic material 428 has an x-direction magnetic field component of less than 0+/−5 mT. In one embodiment, the static magnetic field provided via magnetic material 428 has an x-direction magnetic field component of less than 0+/−20 mT.

Manufacturing the magnetic sensor via encapsulating substrate 400 and part of carrier structure 422 with magnetic material 428 reduces the number of manufacturing process steps and the complexity of the manufacturing process, which reduces the cost of the magnetic sensor. Also, the size of the magnetic sensor can be reduced by using magnetic material 428 to provide the back bias magnetic field. In addition, the sensitivity of the sensing elements 408 and 410 is not reduced with the back bias magnetic field provided via magnetic material 428.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A sensor comprising:
    a substrate having a first major surface on a first side and a second major surface on a second side that opposes the first major surface, wherein the substrate is a semiconductor die, the substrate comprising:
        a sensing element that includes a first ferromagnetic layer and a second ferromagnetic layer and a spacer layer situated between the first ferromagnetic layer and the second ferromagnetic layer, wherein the second ferromagnetic layer is situated on the spacer layer and the spacer layer is situated on the first ferromagnetic layer; and
    magnetic material encapsulating the substrate such that the magnetic material is on the first side and adjacent the first major surface and on the second side and parallel to the second major surface and the magnetic material is magnetized on the first side and the second side of the substrate to provide magnetic field lines that flow substantially perpendicular to the first major surface and the second major surface.

2. The sensor of claim 1, wherein the first ferromagnetic layer and the second ferromagnetic layer are spaced apart by more than 0.1 nanometers and less than 10 nanometers.

3. The sensor of claim 1, wherein the spacer layer comprises a non-ferromagnetic layer between the first ferromagnetic layer and the second ferromagnetic layer.

4. The sensor of claim 1, wherein the spacer layer comprises an insulating layer between the first ferromagnetic layer and the second ferromagnetic layer.

5. The sensor of claim 1, wherein the first ferromagnetic layer and the spacer layer and the second ferromagnetic layer form a magneto-resistor.

6. The sensor of claim 1, wherein the first ferromagnetic layer and the second ferromagnetic layer are part of a giant magneto-resistance sensing element.

7. The sensor of claim 1, comprising at least two contact elements electrically coupled to the substrate.

8. The sensor of claim 1, wherein the semiconductor die comprises an integrated circuit coupled to the first ferromagnetic layer and the second ferromagnetic layer.

9. The sensor of claim 1, wherein the semiconductor die comprises peripheral circuitry for evaluating the resistance of the first ferromagnetic layer and the spacer layer and the second ferromagnetic layer.

10. The sensor of claim 1, wherein the sensor is configured to be used in an automobile application and to sense movement of one of a wheel, a cam shaft, a crank shaft, and a transmission part.

11. The sensor of claim 1, wherein at least part of the substrate is insulated from the magnetic material.

12. A sensor comprising:
    a substrate having a main major surface and an opposing major surface and comprising a giant magneto-resistance sensing element;
    a carrier structure attached to the opposing major surface;
    a contact element electrically coupled to the substrate and the carrier structure;
    insulating material coating the main major surface and the contact element and part of the carrier structure; and
    magnetic material encapsulating the substrate and the contact element and the carrier structure, wherein the magnetic material is adjacent the main major surface and separated from the main major surface by the insulating material and the magnetic material is adjacent the carrier structure and separated from the carrier structure by the insulating material and the magnetic material is substantially parallel to the main major surface and the opposing major surface at the interface between the magnetic material and the substrate and magnetized to provide magnetic field lines that flow through the substrate substantially perpendicular to the main major surface and the opposing major surface.

13. The sensor of claim 12, wherein the magnetic material includes magnetic particles and a polymer.

14. The sensor of claim 12, wherein the magnetic material is applied via one of injection molding and compression molding and transfer molding.

15. A method of manufacturing a sensor, comprising:
    providing a substrate having a first major surface on a first side and a second major surface on a second side that opposes the first major surface, wherein the substrate is a semiconductor die and providing the substrate comprises:
        providing a sensing element that includes a first ferromagnetic layer and a second ferromagnetic layer and a spacer layer situated between the first ferromagnetic layer and the second ferromagnetic layer, wherein the second ferromagnetic layer is situated on the spacer layer and the spacer layer is situated on the first ferromagnetic layer in the substrate;
    encapsulating the substrate with magnetic material such that the magnetic material is on the first side and adjacent the first major surface and on the second side and parallel to the second major surface; and
    magnetizing the magnetic material on the first side and the second side of the substrate to provide magnetic field lines that flow substantially perpendicular to the first major surface and the second major surface.

16. The method of claim 15, comprising:
    applying the substrate to a carrier structure; and
    electrically coupling the substrate to the carrier structure via contact elements.

17. The method of claim 16, wherein encapsulating the substrate comprises:
    encapsulating the contact elements.

18. The method of claim 15, wherein magnetizing the magnetic material comprises:
    magnetizing the magnetic material in one direction.

19. The method of claim 15, wherein providing a sensing element comprises:
    providing a non-ferromagnetic layer in the spacer layer between the first ferromagnetic layer and the second ferromagnetic layer.

20. The method of claim 15, wherein providing a sensing element comprises:
    providing an insulating layer in the spacer layer between the first ferromagnetic layer and the second ferromagnetic layer.

21. A method of manufacturing a sensor, comprising:
    providing a substrate having a main major surface and an opposing major surface and comprising a giant magneto-resistance sensing element;
    attaching the substrate to a carrier structure via the opposing major surface;
    electrically coupling the substrate to the carrier structure via a contact element;

coating the main major surface and the contact element and part of the carrier structure with an insulating material;

encapsulating the substrate and the contact element and the carrier structure with magnetic material such that the magnetic material is adjacent the main major surface and separated from the main major surface by the insulating material and the magnetic material is adjacent the carrier structure and separated from the carrier structure by the insulating material and the magnetic material is substantially parallel to the main major surface and the opposing major surface at the interface between the magnetic material and the substrate; and magnetizing the magnetic material to provide magnetic field lines that flow through the substrate substantially perpendicular to the main major surface and the opposing major surface.

22. The method of claim 21, wherein encapsulating the substrate comprises:

molding via one of injection molding and compression molding and transfer molding.

23. The method of claim 21, wherein the magnetic material includes magnetic particles and a polymer.

* * * * *